United States Patent
Paparisto et al.

(10) Patent No.: US 7,379,339 B2
(45) Date of Patent: May 27, 2008

(54) DEVICE AND PROCEDURE FOR MEASURING MEMORY CELL CURRENTS

(75) Inventors: Edvin Paparisto, München (DE); Stephan Rogl, Münchsdorf (DE)

(73) Assignee: Infineon Technologies AG, Munich (DE)

( * ) Notice: Subject to any disclaimer, the term of this patent is extended or adjusted under 35 U.S.C. 154(b) by 196 days.

(21) Appl. No.: 11/274,483

(22) Filed: Nov. 16, 2005

(65) Prior Publication Data
US 2006/0126388 A1   Jun. 15, 2006

(30) Foreign Application Priority Data
Nov. 17, 2004   (DE) .................. 10 2004 055 466

(51) Int. Cl.
*G11C 11/34* (2006.01)
*G11C 16/06* (2006.01)
(52) U.S. Cl. .................. 365/185.21; 365/198; 365/201
(58) Field of Classification Search ........... 365/185.21, 365/210, 201, 189.01, 198
See application file for complete search history.

(56) References Cited

U.S. PATENT DOCUMENTS

| | | | | |
|---|---|---|---|---|
| 5,889,702 A | * | 3/1999 | Gaultier et al. .......... | 365/185.2 |
| 5,986,937 A | * | 11/1999 | Yero ...................... | 365/185.21 |
| 6,219,277 B1 | * | 4/2001 | Devin et al. ........... | 365/185.21 |
| 6,229,296 B1 | | 5/2001 | Duesman | |
| 6,480,421 B2 | | 11/2002 | Osama | |
| 6,836,443 B2 | * | 12/2004 | Dadashev .................. | 365/207 |

FOREIGN PATENT DOCUMENTS

DE     10135775 B4     2/2004
KR     10-0239729      11/1998

* cited by examiner

*Primary Examiner*—Richard T. Elms
*Assistant Examiner*—Toan Le
(74) *Attorney, Agent, or Firm*—Slater & Matsil, L.L.P.

(57) ABSTRACT

The invention relates to a procedure and a device for measuring memory cell currents, in particular for non-volatile memory components, where the device has a current mirroring device for mirroring a current flowing through a memory cell when it is being read, and delivering an analog current signal generated during the mirroring, or an analog current signal derived from it, to an analog output pad of a memory component.

25 Claims, 2 Drawing Sheets

DEVICE AND PROCEDURE FOR MEASURING MEMORY CELL CURRENTS

CLAIM FOR PRIORITY

This application claims the benefit of priority to German Application No. 10 2004 055 466.8 which was filed in the German language on Nov. 17, 2004, the contents of which are hereby incorporated by reference.

TECHNICAL FIELD OF THE INVENTION

The invention relates to a device and a procedure for measuring memory cell currents.

BACKGROUND OF THE INVENTION

With conventional memory components, in particular conventional semi-conductor memory components, a distinction is made between so-called function memory components (e.g. PLAs, PALs, etc.), and so-called table memory components, e.g. ROM components (ROM=Read Only Memory and/or fixed-value memory)—in particular PROMs, EPROMs, EEPROMs, Flash memory, etc.—, and RAM-components (RAM=Random Access Memory and/or Read/Write memory), for instance DRAMs and SRAMs.

A RAM component is a memory device in which data can be stored after an address has been specified, and from which the data can later be read out again under this address.

Because a RAM component needs to be provided with as many storage cells as possible, it becomes important for the creation of these cells to be kept as simple as possible.

With SRAMs (SRAM=Static Random Access Memory) the individual memory cells for instance consist of a few, e.g. six, transistors, and with so-called DRAMs (DRAM=Dynamic Random Access Memory) usually of only a single suitably controlled capacitive element (e.g. the gate source capacitance of a MOSFET), with the capacitance of which one bit at a time can be stored in the form of charge.

In any event, this charge only persists for a short period, which means that a so-called "refresh" must be performed regularly, e.g. ca. every 64 ms.

In contrast to this, SRAMs do not need any "refresh" to be performed on them; i.e., the data stored in the memory cell persists for as long as the SRAM is provided with an appropriate voltage supply.

In non-volatile memory components (NVMs and/or non-volatile memories), e.g. ROMs, PROMs, EPROMs, EEPROMs, and flash memories in contrast the stored data persists even when the supply voltage is switched off.

In ROM memory components the data in question can be secured during the manufacture of a corresponding memory component (i.e. by the manufacturer) by means of appropriate masks, for instance by providing either a discontinuity or a contact at an appropriate location on a corresponding memory cell matrix. In NMOS-ROM memory components this is for instance done by furnishing the corresponding transistors with an oxide layer of a different thickness between the gate and substrate. An oxide layer of "normal" thickness creates a conductive channel (d=1), while a "thicker than normal" oxide layer will prevent this (d=0).

PROMs are read only memories programmable by the user. The respective memory cells can for instance contain appropriate fuses (for instance thin CrNi layers) that can be melted by the application of suitable currents, and that thereby—irreversibly—have the data bit d=0 written into them. Alternatively the respective memory cells can for instance also contain special Mosfets, in which an additional isolated "floating gate" has been provided. This gate is given a charge during the programming of a corresponding memory cell, whereby the threshold voltage of the respective Mosfet is shifted.

EPROMs are multi-programmable non-volatile read only memory components, i.e. fixed-value memory components, in which the respective programming can be reversed by the user by means of an appropriate erasing program. Mosfets with additional isolated "floating gates" that can be correspondingly charged for programming, are for instance—as with many PROMs—able to be used as memory cells. By means of irradiating the EPROM with UV light the floating gate charge of (all) Mosfets can be reset, whereby the programming (of the whole EPROM) is reversed again.

An EEPROM is understood to be a multi-programmable read only memory component, in which the respective programming can—in contrast with an (UV erasable) EPROM—be electrically reversed bit by bit, byte by byte or one page at a time.

A flash memory and/or flash EEPROM represents a hybrid between an EPROM and an EEPROM. A flash EEPROM is a multi-programmable read only memory component, which—similar to an EEPROM—is electrically erasable, not however bit by bit, or byte by bite, but rather—correspondingly similar to an EPROM—always in its entirety.

In order to program the corresponding memory cells of PROMs, EPROMs, EEPROMs, flash memories, etc. the corresponding memory cells must be charged with (programming) currents of a predetermined level and duration.

In order to read a corresponding memory cell (i.e. in order to determine whether a data bit d=0 or a data bit d=1 has been stored there) so-called reference currents can be used.

A read current resulting for instance from the reading of a memory cell can be compared with a reference current (for instance—in a flash memory—with a reference current at a level of for instance 15 µA (or for instance 5 µA or 20 µA)); depending on whether the corresponding read current is larger or smaller than the corresponding reference current (for instance—depending on the respective cell state—for instance ca. 0 µA (in particular for instance <5 µA), or for instance ca. 30 µA (in particular for instance >20 µA)), it can be determined whether a data bit d=1, or a data bit d=0 has been stored in the corresponding cell.

When testing a read only memory component, an attempt can be made to determine the exact level of the respective read current (for instance for fault finding, or for instance—in accordance with the respective test result—to correspondingly adjust the level and/or duration of the (programming) currents and/or voltages for the normal operation of the memory component, and/or the level of the reference current used in each case, etc., etc.).

The conventionally applied procedures for the testing of a read only memory component in order to measure memory cell currents, in particular read currents, are relatively inaccurate.

SUMMARY OF THE INVENTION

The invention provides novel device and a novel procedure for measuring of memory cell currents.

In one embodiment of the invention, there is a device for measuring memory cell currents, in particular for non-volatile memory components, is made available, whereby the device comprises a current mirroring device for mirroring a current (Icell) flowing through a memory cell when it is being read, and for delivering an analog current signal (Imeasure) generated during mirroring or an a analog current signal derived from it, to an analog output pad of a memory component.

In another embodiment of the invention, a procedure for measuring memory cell currents, in particular for non-volatile memory components, is made available, which comprises mirroring a current (Icell) flowing through a memory cell when it is being read, and delivering an analog current signal (Imeasure) generated during mirroring, or an analog current signal derived from it, to an analog output pad of a memory component.

BRIEF DESCRIPTION OF THE DRAWINGS

The invention is described below in more detail with reference to several embodiment examples and the attached figures. In the figures.

DETAILED DESCRIPTION OF THE INVENTION

Figure 1:
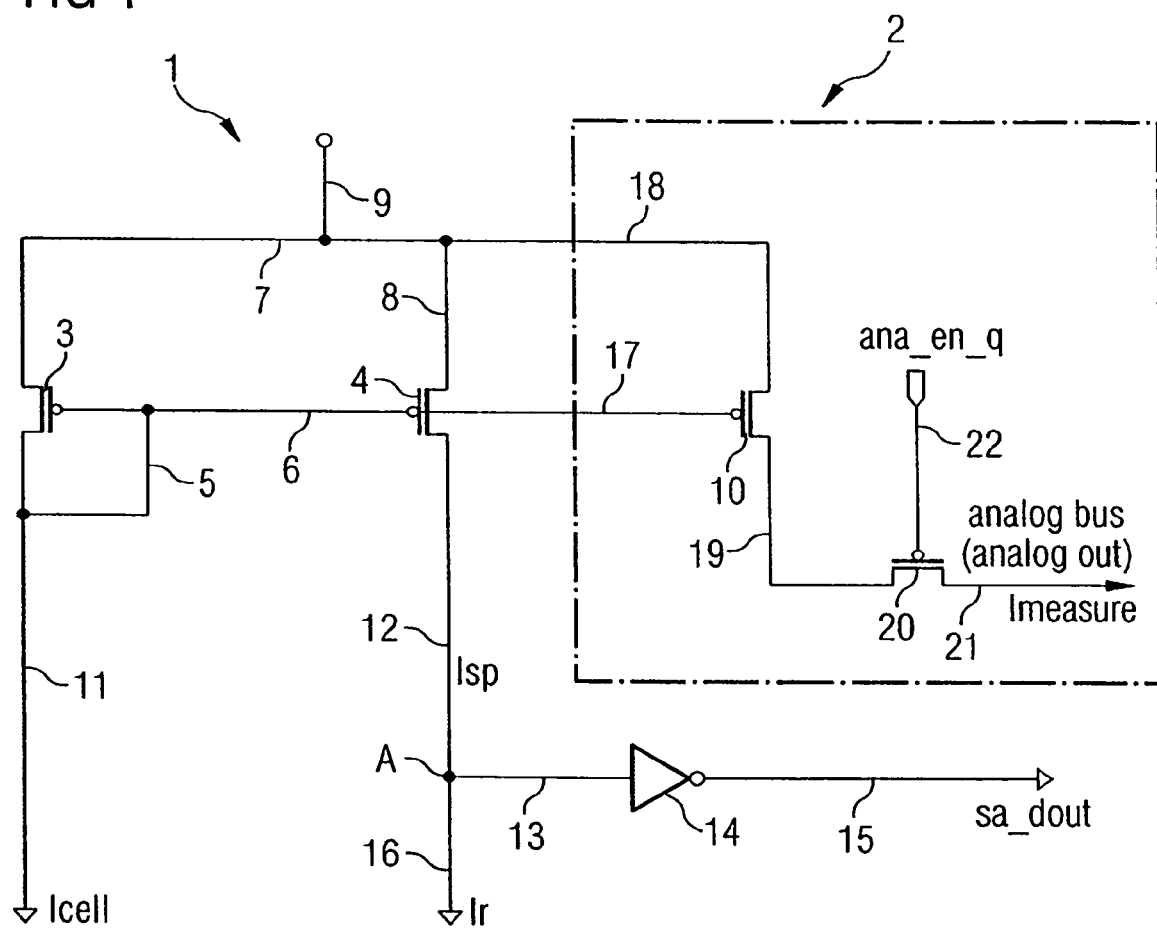
FIG. 1 shows a circuit used for reading a memory cell, and a device connected with it for the exact test-wise measuring of memory cell currents in terms of a first embodiment example of the invention.

In FIG. 1 a schematic representation of a circuit 1 used for reading a memory cell, and a device 2 connected with it for the precise, test-wise measurement of memory cell currents in terms of a first embodiment example of the invention is shown.

The circuit 1 and/or the device 2 can for instance be arranged on a corresponding non-volatile memory component chip (NVM chip and/or non-volatile memory chip) or (as an alternative also externally to it) for instance on a PROM, EPROM, EEPROM or flash memory component chip, in particular on an embedded flash memory, which has been arranged on one and the same chip together with one or more micro controllers (especially advantageously on a memory chip installed in a motor vehicle).

The circuit 1 and/or the device 2 can advantageously form part of a corresponding sense amplifier device and/or sense amplifier.

As is apparent from FIG. 1, the circuit 1 contains two p-MOS field-effect transistors 3, 4.

In the first p-MOS field-effect transistor 3 the gate is connected with the drain via a line 5.

In addition the gate of the first p-MOS field-effect transistor 3 is connected with the gate of the second p-MOS field-effect transistor 4 via a line 6.

The source of the first p-MOS field-effect transistor 3 is connected via a line 7 and a line 8 with the source of the second p-MOS field-effect transistor 4; the two sources of the p-MOS field-effect transistors 3, 4 can be connected (via line 7 and/or 8, and a line 9 connected with it) with a voltage supply source.

As is further apparent from FIG. 1, the drain of the first p-MOS field-effect transistor 3 can be connected with a memory cell of a memory component (for instance with a PROM, EPROM, EEPROM or flash drive memory cell of the above PROM, EPROM, EEPROM via a line 11 (and, if required, with one or more further sense amplifier elements interconnected, in particular the above sense amplifier device.)).

In addition the drain of the second p-MOS field-effect transistor 4 is connected via a line 12 with a (current level) evaluation node A, which is connected via a line 13 with an inverter and/or amplifier 14, which is also connected with an output line 15, and with a (reference current) line 16—connected for instance to earth).

The output line 15 can for instance be connected with a corresponding chip pad, or—simply internally—with corresponding micro-controller input.

The above memory cell—connectable with the first p-MOS field-effect transistor 3 via line 11—is arranged to lie—together with a plurality of further memory cells—in a corresponding memory cell array of the memory component (whereby the memory cells in each case—lying next to one another—are arranged to lie in a plurality of memory cell rows and columns).

The memory component can include a single memory cell array, or—preferably—a plurality (for instance for or more) corresponding arrays, whereby for instance more than 32, 64, 128, 256, or 512, etc. Mbit of data can be stored in each array (in particular in memory cells provided there).

The individual memory cells can be either be brought into a programmed state, or into an cancelled state (which for instance always represents a more or a less conductive state of the memory cell, and which has for instance in each case been allocated to a stored data bit d=0, and/or a stored data bit d=1).

In order to program corresponding memory cells, they can be charged with (programming) current pulses and/or voltages of a pre-determined level and/or duration and/or number.

In order to read corresponding memory cells (i.e. in order to determine whether a data bit d=0, or a data bit d=1 has been stored there) so-called reference currents can be used.

During normal operation for instance, a read current (Icell) resulting from reading a memory cell during the normal operation of the memory component (and for instance present on line 11)—or a current (Isp) correspondingly resulting from the measurement of the read current (Icell) (and for instance present on line 12) can, by means of a corresponding comparator device provided on the chip, be compared with a reference current Ir (for instance supplied on line 16)(for instance—in the case of a flash drive—with a reference current at a level of for instance 15 µA (or for instance 5 µA or 20 µA)); depending on whether the corresponding read current is larger or smaller than the corresponding reference current (for instance—depending on the state of the respective cell—for instance ca. 0 µA (in particular for instance <5 µA), or for instance ca. 30 µA (in particular for instance >20 µA)), it can be determined whether a data bit d=1, or a data bit d=0 is stored in the corresponding memory cell.

If the comparator device determines that a data bit d=1 has been stored in the corresponding memory cell, a "high logic" (or alternatively: a "low logic")—digital—output signal (made available via line 13 and/or line 15) can be emitted onto a corresponding pad of the chip (conversely—if the comparator device should determine that a data bit d=0 is stored in the corresponding memory cell—for instance a "low logic" (or alternatively: a "high logic")—digital—output signal can be emitted at the corresponding pad of the chip) (or internally to a micro controller lying on the same chip as the memory component).

In order to mirror the read currents (Icell) resulting from reading a memory cell—for instance during the reading of the memory connected via line 11 with the first p-MOS field-effect transistor 3—the second p-MOS field-effect transistor 4 already mentioned above is provided in the above circuit 1.

Both of the two p-MOS field-effect transistors 3, 4 are essentially of the same dimensions and are both operated—as is apparent from the representation in terms of FIG. 1, and the preceding exposition—by the same gate-source voltage, and always at saturation level. This ensures that the current (Isp)—present on line 12—used in order to evaluate the cell state of the memory component 4 during normal operation corresponds with the read current (Icell) resulting from reading the memory cell and present on line 11.

During the normal operation of the memory component—described above and depending on the state of the memory cell being read in each case, as determined by the comparator device, either—as is apparent from the above exposition—corresponding "high logic" or "low logic"—digital—output signals are available at the corresponding chip pad (and/or simply internally at the respective micro controller)).

For the precise determination and/or measurement of the level of the respective read currents (Icell)—depending on the state of the memory cell—in particular during a memory component test operation as is more closely described below, the conventional (memory cell current measurement) device 2—shown in FIG. 1—connected with the (memory cell read) circuit 1—shown edged with a broken line in FIG. 1—can be used.

In accordance with the actual level of the read current determined in each case, then for instance—for the normal operation of the memory component—the level and/or duration and/or number of the (programming) current pulses and/or voltages can be accordingly changed and/or adjusted, and/or the level of the reference current used in each case, etc., etc. and/or the determined level of the read current, can be used for fault finding, etc.

The above (memory cell current measurement) device 2 can—as is more closely described below—be accordingly deactivated during the normal operation of the memory component, and—if needed—correspondingly activated during the above test operation.

The above test operation can for instance be performed during the completed and/or semi-completed state of a corresponding semi-conductor component, in particular a memory component, and/or before or after the installation of the corresponding (completed) semi-conductor component, in particular memory component, in a corresponding component housing and/or electronic module, etc.

As is apparent from FIG. 1, the (memory cell current measurement) device 2 includes two p-MOS field-effect transistors 10, 20.

The gate of the p-MOS field-effect transistor 10 (here acting as a current level measurement transistor) is connected with the above line 6 via a line 17, and thereby with the gate of the first p-MOS field-effect transistor 3 (and with the second p-MOS field-effect transistor 4).

As is further apparent from FIG. 1, the source of the p-MOS field-effect transistor 10 is connected via a line 18 with the line 7 and thereby with the source of the first p-MOS field-effect transistor 5 (and with the second p-MOS field-effect transistor 4), as well as with the above supply voltage source, which is connected with line 9.

The drain of the p-MOS field-effect transistor 10 is connected via a line 19 with the source-drain path of the p-MOS field-effect transistor 20 (used as activation/deactivation transistor), of which the source-drain path is also connected with an (analog) bus system via a line 21, which is connectable with a corresponding—special—further pad of the memory component chip.

The p-MOS field-effect transistor 20 can be brought from a non-conductive into a conductive state (and vice versa), i.e. correspondingly from a deactivated into an activated state (and vice versa) by applying an appropriate control signal ana_en_q to a control line 22—connected with the gate of the p-MOS field-effect transistor 20—(whereby the memory cell current measurement device 2 in its entirety can be correspondingly activated (or deactivated)).

The number of memory cell current measurement devices and/or memory cell read circuits provided on a corresponding memory component chip—corresponding in construction and/or operating method with the memory cell current measurement device 2 and/or memory cell read circuit 1—can be substantially smaller than the number of memory cells provided in total (for instance the number of pro array and/or sub array memory cells and/or sense amplifiers able to be jointly activated in each case, correspond with the number of sense amplifiers provided on the chip, etc.). There can for instance be between 1 and 128 memory cell current measurement devices and/or memory cell read circuits provided on one chip, in particular for instance between 1 and 32 memory cell current measurement devices and/or memory cell read circuits, etc., or alternatively for instance also more than 10, 20 or 50 corresponding devices/circuits, etc. In order to read corresponding memory cells (and/or for measuring the resulting read currents) the corresponding memory cell current measuring device and/or memory cell read circuit is conductively connected with the respective memory cell.

In order to perform a—precise—measurement of the read currents (Icell) resulting from the read of the memory cell connectable with line 11 during the above memory component test operation, the activation/deactivation transistor (i.e. the p-MOS field-effect transistor 20) provided in the memory cell current measurement device 2 is brought into a conductive, i.e. an activated state (for instance by applying a low logic control signal ana_en_q to line 22)—and thereby the drain of the p-MOS field-effect transistor 10 is conductively connected with line 21, which is conductively connected with the above (analog bus) system—(and thereby the memory cell current measurement device 2 is correspondingly activated in its entirety).

The p-MOS field-effect transistor 3, and the p-MOS field-effect transistor 10 are essentially of identical dimensions, and are both—as is apparent from the representation in terms of FIG. 1, and from what has been mentioned above—operated with the same gate source voltage, and always in a fully saturated state.

The read current (Icell) present on line—resulting during the read of the memory cell—is thereby "mirrored" by the above memory cell current measurement device 2; the current Imeasure, flowing via the source drain path of the p-MOS field-effect transistor 10, and further via the source drain path of the p-MOS field-effect transistor 20 (which is preferably not being operated in the saturation range) to the above line 21 (and which can be tapped and measured externally at the above special pad of the chip in analog form) then corresponds with the read current (Icell) resulting during the reading of the memory cell).

As illustrated above, the above—special—pad can be connected via the above (analog) bus system with the above line 21 (and thereby with the memory cell current measurement device 2). In correspondingly similar fashion, one or more further memory cell current measurement devices—corresponding with the memory cell current measurement device 2 shown in FIG. 1 in terms of structure and/or function—can be connectable with the above—special—pad (i.e. depending appropriate control signals, and in accordance with the memory cell current measurement device 2, either electrically connected with the—special—pad or electrically disconnected from it).

In this way it can be achieved that the total number of—special—pads to be provided on the memory component and serving to emit analog measurement currents Imeasure—pads can be smaller than the above number of memory cell current measurement devices 2.

Figure 2:
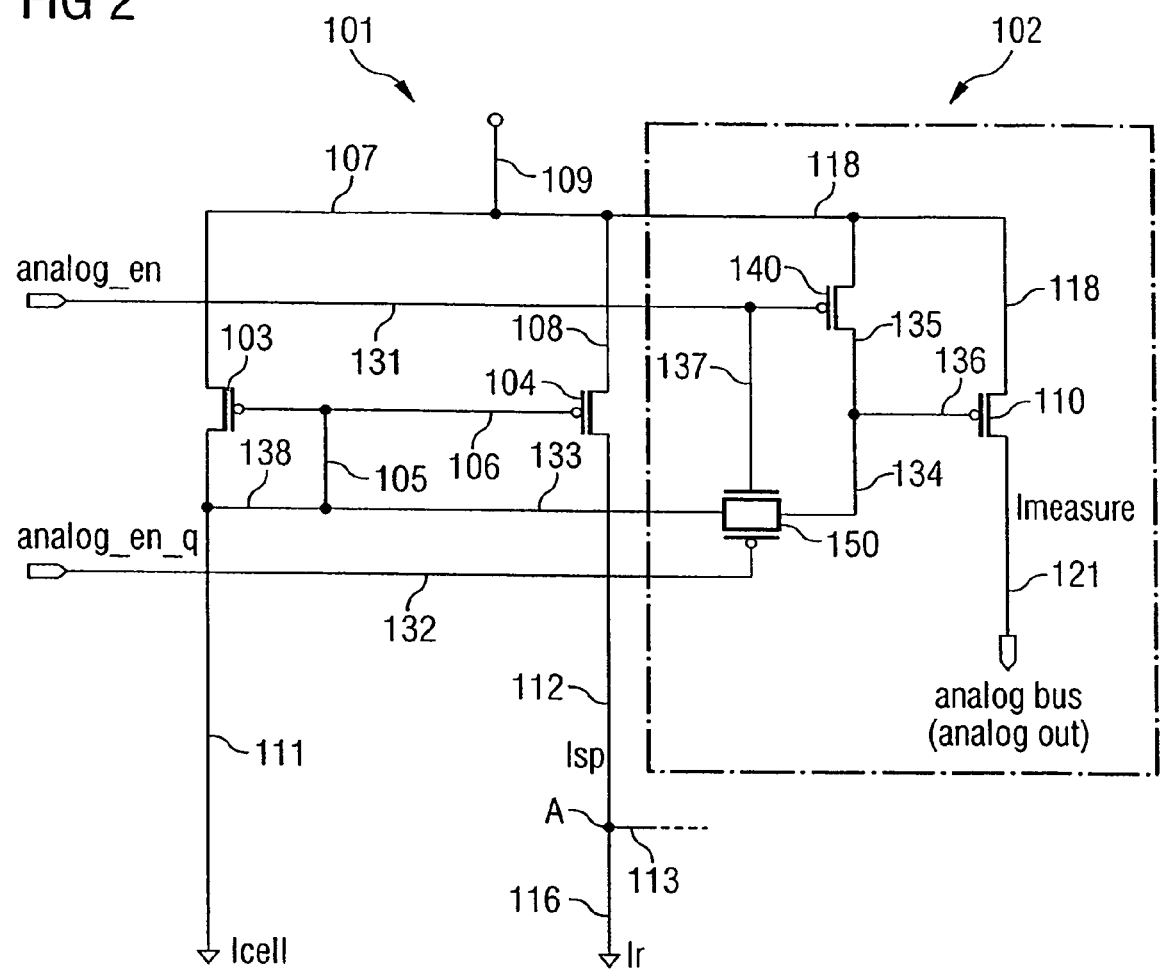
FIG. 2 shows a circuit used for reading a memory cell, and a device connected with it for the precise test-wise measurement of memory cell currents in terms of an alternative second embodiment example of the invention.

In FIG. 2 a schematic representation of a circuit 101 used for the reading of a memory cell—corresponding or essentially corresponding with the circuit 1 shown in FIG. 1 in structure and/or function—is shown, and a device 102 connected with it for the precise test-wise measurement of memory cell currents in terms of an alternative, second embodiment example of the invention.

The circuit 101 and/or the device 102 can for instance be arranged on a corresponding non-volatile memory component chip (NVM chip and/or Non-volatile memory chip) (or alternatively also externally to it), for instance on a PROM, EPROM, EEPROM or flash memory component chip, in particular on an embedded flash drive, which has been arranged together with one or more micro-controllers on one and the same chip (particularly advantageously on a memory component chip installed in a motor vehicle).

The circuit 101 and/or the device 102 can advantageously form part of a corresponding sense amplifier device and/or a sense amplifier.

As is apparent from FIG. 2, the circuit 101 contains two p-MOS field-effect transistors 103, 104.

In the first p-MOS field-effect transistor 103, the gate is connected with the drain via a line 105, and a line 138 connected with it.

In addition the gate of the first p-MOS field-effect transistor 103 is connected with the gate of the second p-MOS field-effect transistor 104 via a line 106.

The source of the first p-MOS field-effect transistor 103 is connected via a line 107 and a line 108 with the source of the second p-MOS field-effect transistor 104; both the sources of the p-MOS field-effect transistors 103, 104 can be connected (via the line 107 and/or 108, and a line 109 connected with it) with a supply voltage source.

As is further apparent from FIG. 2, the drain of the first p-MOS field-effect transistor 103 can be connected via a line 111 (and where needed with one or more further sense amplifier elements not shown here interconnected, in particular the above read amplifier device) with a memory cell of a memory component (for instance a PROM, EPROM, EEPROM or flash memory component memory cell of the above PROM, EPROM, EEPROM or flash memory components).

In addition, the drain of the second p-MOS field-effect transistor 104 is connected via a line 112 with a (current level) evaluation node A, which can be connected with an inverter and/or amplifier (not shown here) connected with an output line, and with a (reference current) line 116, connected to earth.

The above memory cell—connectable via line 111 with the first p-MOS field-effect transistor 103—has been arranged—together with a plurality of further memory cells—to lie a in corresponding memory cell array of the memory component (whereby the memory cells in each case are lying—adjacent to one another—in a plurality of memory cell rows and columns).

The memory component can include a single memory cell array or—preferably—a plurality (for instance four or more) of corresponding arrays, whereby for instance more than 32, 64, 128, 256, or 512, etc. Mbits of data can be stored in each array (in particular in the memory cells provided there).

The individual memory cells can be brought either into a programmed state, or an cancelled state (which for instance always corresponds with a more or less conductive state of the memory cell, and is for instance always allocated to a stored data bit d=0, and/or a stored data bit d=1).

In order to program corresponding memory cells, they can be charged with (programming) current pulses and/or voltages of a pre-determined height and/or duration and/or number.

To read corresponding memory cells (i.e. to determine whether a data bit d=0, or a data bit d=1 has been stored there) so-called reference currents can be used.

For instance during the normal operation of the memory component, a read current (Icell)(for instance present on line 111) and resulting from the reading of a memory cell—or a corresponding current (Isp) resulting from the mirroring of the read current (Icell)(for instance present on line 112)—can be compared by means of an appropriate comparator device provided on the chip with a reference current Ir (for instance supplied to a line 116)) (for instance—in the case of a flash drive—with a reference current at the level of for instance 15 µA (or for instance 5 µA or 20 µA)); depending on whether the corresponding read current is larger or smaller than the corresponding reference current (for instance—depending on the respective cell state—for instance ca. 0 µA (in particular for instance <5 µA), or for instance ca. 30 µA (in particular for instance >20 µA)), it can be determined whether a data bit d=1 or a data bit d=0 has been stored in the corresponding memory cell.

If it is determined by the comparator device that a data bit d=1 has been stored in the corresponding memory cell, for instance a "high logic" (or alternatively: a "low logic")—digital—output signal (made available via a line 113), can be emitted to a corresponding pad of the chip, (or vice versa—if the comparator device should determine that a data bit d=0 has been stored in the corresponding memory cell—for instance a "low logic" (or alternatively: a "high logic")—digital—output signal can be emitted to the corresponding pad of the chip) (or internally to a micro-controller lying on the same chip as the memory component).

In order to mirror the read current (Icell) resulting during the reading of a memory cell—for instance during the reading of the memory cell connected via line 111 with the first p-MOS field-effect transistor 103—the second p-MOS field-effect transistor 104, as already mentioned before, has been provided in the above circuit 101.

Both the p-MOS field-effect transistors 103, 104 have essentially identical dimensions, and both are operated—as is apparent from the representation in terms of FIG. 2 and what has been said above—with the same gate-source voltage, and always in a fully saturated state. In this way it can be assured that the current (Isp) present on line 112—used for evaluating the cell state during the normal operation of the memory component—corresponds with the read current (Icell) present on line 111 and resulting from the reading of the memory cell.

As is apparent from the above exposition, during the normal operation of the memory component—as described above—and depending on the state of the respective memory cell being read as determined by the comparator device—either corresponding "high logic" or "low logic"—digital—output signals are available at the corresponding chip-pad (and/or simply internally at the respective microcontroller).

For the precise measurement and/or determination of the level of the respective read current (Icell)—which is dependent on the state of the memory cell—in particular during a memory component test operation, and as is more closely described below, the (memory cell current measurement) device 102, shown edged with a broken line in FIG. 2 and connected with the—conventional—(memory cell read) circuit 101 shown in FIG. 2—can be used as is more closely described below.

In accordance with the actual level of the read current determined in each case—for the normal operation of the memory component—for instance the level and/or duration and/or number of (programming) current pulses and/or voltages can then be correspondingly modified and/or adjusted, and/or the level of the reference current used in each case, etc., etc., and/or the measured level of the read current can be used for fault finding, etc.

The above (memory cell current measurement) device 102 can—as is more closely described below—be correspondingly deactivated during the normal operation of the memory component and—where needed—correspondingly activated during the above test operation.

As is apparent from FIG. 2, the (memory cell current measurement) device 2 contains two p-MOS field-effect transistors 110, 140 as well as a transmission gate 150.

The gate of the p-MOS field-effect transistor 110 (operating here—like the transistor 10 shown in FIG. 1—as a current mirroring transistor) is connected via a line 136 and a line 134, and with the interconnection of a transmission gate 150 (operating here as an activation/deactivation transmission gate)—with a line 133, and thereby with the above line 105, and consequently also with the gate of the first p-MOS field-effect transistor 103 (and of the second p-MOS field-effect transistor 104).

As is further apparent from FIG. 1, the source of the p-MOS field-effect transistor 110 is connected via a line 118 with the above line 107, and thereby with the source of the first p-MOS field-effect transistor 5 (and of the second p-MOS field-effect transistor 4), as well as with the above voltage supply source, which is connected with line 9.

In addition, the source of the p-MOS field-effect transistor 110 is connected with the source of the p-MOS field-effect transistor 140 (here operating as an activation/deactivation transistor), of which the drain is connected with the above lines 134, 135 via a line 135, and thereby with the gate of the p-MOS field-effect transistor 110.

The gate of the p-MOS field-effect transistor 140 is connected with a control line 131 via a line 131, which is connected via a line 137 with a first control input of the transmission gate 150.

As is further apparent from FIG. 2, a second (inverted) control input of the transmission gate 150 is connected with a second control line 132, which is inverted in relation to the above first control line 131.

The drain of the p-MOS field-effect transistor 110 is connected via a line 121 with an (analog) bus system, which is connectable with a corresponding—special—further pad of the a memory component chip, which pad is connected to earth.

Advantageously the drain of the p-MOS field-effect transistor 110 should be directly connected via the bus system, and in particular it should be connectable with the above—special—further pad without the inter-connection of corresponding current comparator devices, and/or inverters and/or amplifiers, and/or analog/digital inverters, etc.

If for instance a "low logic" control signal analog_en (for instance 0V) is present on the control line 131 and a "high logic" control signal analog_en_q (for instance VDD) is present on line 132), the p-MOS field-effect transistor 140 is brought into a conductive state, and the transmission gate 150 into a blocked state, whereby the memory cell current measurement device 102 in its entirety can be accordingly brought into a deactivated state.

In order to activate the memory cell current measurement device 102, a "high logic" control signal analog_en (for instance VDD) can be applied correspondingly inverted to the control line 131 for instance) and a "low logic" control signal analog en_q (for instance 0V) to the control line 132. In this way the p-MOS field-effect transistor 140 is brought into a blocked state and the transmission gate 150 into a conductive state.

The number of memory cell current measurement devices and/or memory cell read circuits provided on the corresponding memory component-chip—which correspond with the memory cell current measurement device 102 and/or memory cell read circuit shown in 101 in FIG. 2 in structure and function—can be substantially smaller than the total number of memory cells provided (for instance than the number of the respective pro array and/or sub array memory cells and/or sense amplifiers able to be jointly activated, and/or the number of sense amplifiers provided on the chip, etc.). For instance, between 1 and 128 memory cell current measurement devices and/or memory cell read circuits can be provided on one chip, in particular for instance between 1 and 32 memory cell current measurement devices and/or memory cell read circuits, etc., or alternatively for instance also more than 10, 20 or 50 corresponding devices/circuits, etc. In order to read corresponding memory cells (and/or for measuring the read currents resulting herefrom) the corresponding memory cell current measurement device and/or memory cell read circuit is in each case conductively connected with the respective memory cell.

In order to perform a—precise—measurement of the read current (Icell) resulting from the reading of the memory cell connectable with line 111 during the above memory component-test operation, the activation/deactivation transistor (i.e. the p-MOS field-effect transistor 120) provided in the memory cell current measurement device 102 is brought into a blocked state, and the activation/deactivation transmission-gate (i.e. the transmission-gate 150) provided in the memory cell current measurement device 102, into a conductive state (thereby activating—in its entirety—the memory cell current measurement device 102).

The gate of the p-MOS field-effect transistor 110 will then be conductively connected with the gate of the first p-MOS field-effect transistor 103 (and with the gate of the second p-MOS field-effect transistor 104), and disconnected—due to the p-MOS field-effect transistor 140 then being non-conductive—from the source of the p-MOS field-effect transistor 110.

The first p-MOS field-effect transistor 103, and the p-MOS field-effect transistor 110 are essentially of identical dimensions, and are both—as is apparent from the representation in terms of FIG. 1, and what has been said above—with the memory cell current measurement device 102 activated, operated with the same gate-source-voltage, and always at full saturation.

The read current (Icell) present on line 111—resulting during the reading the memory cell—is thereby "mirrored" by the above memory cell current measurement device 102

(in particular by the p-MOS field-effect transistor 110); the current Imeasure flowing via the source drain path of the p-MOS field-effect transistor 110 (and which can be externally tapped and measured in analog form at the above special pad of the 10 chip) to the above line 121 then corresponds with the read current (Icell) resulting from the reading of the memory cell As illustrated above, the above—special—pad can be connected with the above line 121 (and thereby with the memory cell current measurement device 102) via the above (analog) bus system. Correspondingly similar, one or more further memory cell current measurement devices—corresponding with the current measurement device 102 shown in FIG. 2 in structure and/or function—can also be connectable with the above—special—pad (i.e. depending on corresponding control signals, and in accordance with whether the memory cell current measurement device 102 is either electrically connected with the—special—pad, or electrically disconnected from it).

In this way it can be achieved that the number of—special pads serving to emit analog measurement currents Imeasure needing to be provided in total on the memory component—can be smaller than the above number of memory cell current measurement devices 102.

With the help of the memory cell current measurement devices 2, 102 shown in FIGS. 1 and 2, it can be achieved that the memory cell being read in each case during the analog current measurement in test operation, is in the same and/or essentially the same state, in particular at the same point in the operation, as during normal operation and/or normal read operation.

In addition, with the above analog current measurement procedure and with the use of the memory cell current measurement devices 2, 102—in particular in comparison with conventional analog measurement procedures—mensurational uncertainties, generated by track resistances such as for instance metallic conductors, transfer gates, etc. can be substantially reduced and/or eliminated.

What is claimed is:

1. A device for measuring memory cell currents, the device comprising:
   a current mirroring device for mirroring a current flowing through a memory cell when it is being read and delivering an analog current signal generated during mirroring, or an analog current signal derived from it, to an analog output pad of a memory component; and
   an activation/deactivation device comprising a first circuit device connected between the current mirroring device and a memory cell read circuit.

2. The device according to claim 1, wherein the current mirroring device comprises a field-effect transistor.

3. The device according to claim 2, wherein a source or drain output of the transistor is connectable with the analog output pad of the memory component.

4. The device according to claim 2, wherein the memory cell read circuit comprises a field-effect transistor.

5. The device according to claim 4, wherein the memory cell read circuit comprises a further field-effect transistor.

6. The device according to claim 4, wherein a gate of the current mirroring device comprises a field-effect transistor is connectable with the gate of the memory cell read circuit transistor.

7. The device according to claim 6, wherein the gate of the memory cell read circuit transistor is coupled to a drain of the memory cell read circuit transistor.

8. The device according to claim 6, wherein a source of the memory cell read circuit transistor is coupled to a source of the current mirror transistor.

9. The device according to claim 1, wherein the activation/deactivation device deactivates the current mirroring device during a normal operation of the memory component, and activates the current mirroring device during a test operation of the memory component.

10. The device according to claim 9, wherein the activation/deactivation device comprises a second circuit device connected between the current mirroring device and the analog output pad.

11. The device according to claim 1, wherein the first circuit device comprises a transistor and/or a transmission gate.

12. The device according to claim 1, wherein the device for measuring memory cell currents is part of a sense amplifier device.

13. The device according to claim 1, wherein the analog current signal generated during mirroring is delivered to the analog output pad.

14. The device according to claim 1, wherein the analog current signal derived from the current signal generated during mirroring is delivered to the analog output pad.

15. A device for measuring memory cell currents, the device comprising:
    a current mirroring device for mirroring a current flowing through a memory cell when it is being read and delivering an analog current signal derived from the current mirroring device to an output; and
    an activation/deactivation device coupled between the current mirroring device and a memory cell read circuit.

16. The device according to claim 15, wherein the activation/deactivation device comprises a transmission gate.

17. The device according to claim 15, wherein the output comprises an analog bus.

18. The device according to claim 15, wherein the output comprises an analog output pad.

19. The device according to claim 15, further comprising an amplifier coupled to the output.

20. The device according to claim 15, wherein the output is coupled to a micro-controller.

21. A device for measuring memory cell currents, the device comprising a current mirroring device for mirroring a current flowing through a memory cell when it is being read, the current mirroring device coupled to an analog output pad of a memory component, wherein an analog current derived from or generated by the current mirroring device is delivered to the analog output pad while the memory component is in a test mode.

22. The device of claim 21, further comprising a memory cell read circuit coupled to the memory cell.

23. The device of claim 22, further comprising an activation/deactivation circuit coupled to the current mirroring device and coupled to the memory cell.

24. The device of claim 23, wherein the activation/deactivation circuit activates the current mirroring device during the test mode.

25. The device of claim 23, wherein the activation/deactivation circuit deactivates the current mirroring device during a normal operation mode.

* * * * *